US009844153B2

United States Patent
Hwang et al.

(10) Patent No.: US 9,844,153 B2
(45) Date of Patent: *Dec. 12, 2017

(54) DISPLAY DEVICE

(71) Applicant: Samsung Electronics Co., Ltd., Suwon-si (KR)

(72) Inventors: Kwang Sung Hwang, Suwon-si (KR); Hyung Suk Park, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/175,683

(22) Filed: Jun. 7, 2016

(65) Prior Publication Data

US 2016/0295713 A1 Oct. 6, 2016

Related U.S. Application Data

(63) Continuation of application No. 14/066,792, filed on Oct. 30, 2013, now Pat. No. 9,392,715, which is a (Continued)

(30) Foreign Application Priority Data

Jan. 7, 2010 (KR) .................. 10-2010-0001371

(51) Int. Cl.
*H05K 1/14* (2006.01)
*H05K 5/00* (2006.01)
(Continued)

(52) U.S. Cl.
CPC ......... *H05K 5/0017* (2013.01); *G06F 1/1601* (2013.01); *H05K 5/0026* (2013.01);
(Continued)

(58) Field of Classification Search
CPC ...... H05K 5/0017; H05K 5/0026; H05K 5/02; H05K 5/03; H05K 7/02; G06F 1/1601
(Continued)

(56) References Cited

U.S. PATENT DOCUMENTS 6,020,867 A 2/2000 Shimada et al.
6,307,530 B1 10/2001 Cho
(Continued)

FOREIGN PATENT DOCUMENTS

CN 1396379 2/2003
EA 2076107 7/2009
(Continued)

OTHER PUBLICATIONS

Extended European Search Report dated Oct. 4, 2016 in European Patent Application No. 10197330.3.
(Continued)

*Primary Examiner* — Hung S Bui
(74) *Attorney, Agent, or Firm* — Staas & Halsey LLP

(57) ABSTRACT

A display device having a compact structure includes a main board and an inverter board of the display device connected to each other. A bracket supports the main board and the inverter board. The bracket includes a shielding part to block electromagnetic waves, an inverter board holding part to allow the inverter board to be easily seated on the bracket, and a support and fixing part to support and fix the bracket. Further, a front cover and a back cover are connected in a snap-fit manner, and a bottom chassis includes a cable receipt groove to organize the internal wiring of the display device.

16 Claims, 12 Drawing Sheets

Related U.S. Application Data continuation of application No. 12/975,851, filed on Dec. 22, 2010, now Pat. No. 8,587,960.

(51) Int. Cl.
*H05K 5/02* (2006.01)
*H05K 7/02* (2006.01)
*G06F 1/16* (2006.01)
*H05K 5/03* (2006.01)

(52) U.S. Cl.
CPC .............. *H05K 5/02* (2013.01); *H05K 5/0247* (2013.01); *H05K 5/03* (2013.01); *H05K 7/02* (2013.01)

(58) Field of Classification Search
USPC ........................................................ 361/736
See application file for complete search history.

(56) References Cited

U.S. PATENT DOCUMENTS

| | | | |
|---|---|---|---|
| 6,441,828 | B1 | 8/2002 | Oba et al. |
| 6,456,499 | B1 | 9/2002 | Nakajima et al. |
| 7,196,750 | B2 | 3/2007 | Koo et al. |
| 7,229,226 | B2 | 6/2007 | Silverbrook |
| 7,301,782 | B2 | 11/2007 | Lee et al. |
| 7,414,832 | B2 | 8/2008 | Wang et al. |
| 7,453,685 | B2 | 11/2008 | Lube |
| 7,911,807 | B2 * | 3/2011 | Park .................. G02F 1/133308 361/799 |
| 7,929,318 | B2 | 4/2011 | Matsutani |
| 7,969,720 | B2 | 6/2011 | Zhang |
| 8,098,338 | B2 | 1/2012 | Tomikawa |
| 8,400,767 | B2 | 3/2013 | Yeom et al. |
| 8,587,960 | B2 | 11/2013 | Hwang et al. |
| 8,675,143 | B2 | 3/2014 | Fukumoto |
| 8,708,293 | B2 | 4/2014 | Yokawa |
| 9,392,715 | B2 * | 7/2016 | Hwang .................. H05K 5/02 |
| 2002/0075253 | A1 | 6/2002 | Park et al. |
| 2005/0019082 | A1 | 1/2005 | Silverbrook |
| 2006/0061958 | A1 | 3/2006 | Solomon et al. |
| 2006/0203174 | A1 | 9/2006 | Ha et al. |
| 2007/0153454 | A1 | 7/2007 | Chang et al. |
| 2008/0068531 | A1 | 3/2008 | Tomikawa |
| 2010/0026912 | A1 | 2/2010 | Ho |
| 2013/0286298 | A1 | 10/2013 | Sakuma et al. |

FOREIGN PATENT DOCUMENTS

| | | |
|---|---|---|
| KR | 10-2000-0050689 | 8/2000 |
| KR | 10-2004-0103673 | 12/2004 |

OTHER PUBLICATIONS

Chinese Office Action issued Jun. 26, 2014 in Chinese Patent Application No. 201110000834.9.
Decision on Grant dated Mar. 24, 2015 in Chinese Patent Application No. 201110000834.9, 4 pages.
Korean Office Action dated Nov. 20, 2015 in Korean Patent Application No. 10-2010-0001371.
Notice of Allowance issued Jul. 15, 2013 in U.S. Appl. No. 12/975,851.
US Office Action issued Mar. 25, 2013 in U.S. Appl. No. 12/975,851.
US Restriction Requirement issued Dec. 11, 2012 in U.S. Appl. No. 12/975,851.
US Notice of Allowance issued Feb. 2, 2015 in U.S. Appl. No. 14/066,792.
US Office Communication dated Jan. 15, 2015 in U.S. Appl. No. 14/066,792.
US Notice of Allowance dated Apr. 18, 2016 in U.S. Appl. No. 14/066,792.
US Supplemental Notice of Allowance dated Feb. 23, 2016 in U.S. Appl. No. 14/066,792.
US Notice of Allowance dated Jan. 26, 2016 in U.S. Appl. No. 14/066,792.
US Notice of Allowance dated May 11, 2015 in U.S. Appl. No. 14/066,792.
US Office Action dated Sep. 17, 2015 in U.S. Appl. No. 14/066,792.
US Office Action dated Aug. 1, 2014 in U.S. Appl. No. 14/066,792.
U.S. Appl. No. 14/066,792, filed Oct. 30, 2013, Kwang Sung Hwang, Samsung Electronics Co., Ltd.
Chinese Office Action dated May 10, 2017 in Chinese Patent Application No. 201510264711.4.
European Office Action dated Jun. 9, 2017 in European Patent Application No. 10197330.3.
Extended European Search Report dated Sep. 18, 2017 in European Patent Application No. 17187365.6.

\* cited by examiner

DISPLAY DEVICE

CROSS-REFERENCE TO RELATED APPLICATIONS

This application is a Continuation Application of U.S. patent application Ser. No. 14/066,792 filed Oct. 30, 2013, which is a Continuation Application of U.S. patent application Ser. No. 12/975,851, filed on Dec. 22, 2010 in the United States Patent and Trademark Office, which claims priority under 35 U.S.C. §119(a) from Korean Patent Application No. 10-2010-0001371, filed on Jan. 7, 2010 in the Korean Intellectual Property Office, the disclosure of which is incorporated herein by reference.

BACKGROUND

1. Field of the Invention

Embodiments of the present general inventive concept relate to a display device which is improved to have a compact structure.

2. Description of the Related Art

Display devices serve to display an image on a screen, and representatively correspond to TVs and computer monitors.

In general, a display device includes a cover forming an external appearance of the display device, a display module received in the cover to display an image, and a circuit board on which electric components required to operate and control the display module are disposed.

In order to comply with recent development of high-level display devices, various requirements of customers as well as basic performance of the display devices are being focused upon.

These requirements satisfy user convenience and aesthetic sense. Accordingly, a display device having a compact structure has been desired.

SUMMARY

The present general inventive concept provides a display device having a compact structure.

The present general inventive concept also provides a display device in which an installation structure of a circuit board is improved.

Additional features of the general inventive concept will be set forth in part in the description which follows and, in part, will be obvious from the description, or may be learned by practice of the general inventive concept.

In accordance with embodiments of the present general inventive concept provides a display device which includes a display module including a display panel and a back light unit, a front cover provided in front of the display module to receive the display module, a main board electrically connected with the display module to control the display module, and including a power input unit and at least one image signal input unit, an inverter board disposed adjacent to the main board and electrically connected with the main board to supply power to the back light unit, a bracket provided on the rear surface of the display module to support the main board and the inverter board, and a back cover forming the rear surface of the display device and connected with the front cover.

The inverter board may be directly connected with the main board.

The display module may further include a bottom chassis provided to receive the display panel and the back light unit, and the bottom chassis may include a cable receipt groove provided to receive a cable connecting the back light unit and the inverter board.

The bracket may include a support and fixing part to support and fix the bracket, and a position of the support and fixing part may be guided by inserting fixing protrusions formed on the front cover into the support and fixing part.

The bracket may include a shielding part provided to block electromagnetic waves generated from the main board.

The bracket may include an inverter board holding part provided to allow the inverter board to be inserted thereinto.

The inverter board holding part may include side guides to guide the side surface of the inverter board, upper guides to guide the upper portion of the inverter board, and lower guides to guide the lower portion of the inverter board.

The bracket may include electromagnetic wave blocking gaskets provided between the bracket and the display module to block electromagnetic waves.

The back cover may include a bracket receipt part to support and receive the bracket, and the bracket receipt part may include upper guides, side guides, and lower guides to guide the position of the shielding part.

The back cover may include a reinforcing bracket to reinforce the strength of the back cover.

The at least one image signal input unit may include a Digital Visual Interface (DVI) input unit to which an image signal is input, and a High Definition Multimedia Interface (HDMI) input unit to which an image signal and an audio signal are input.

The main board may further include an output unit to output a signal, and the output unit may include a speaker output unit from which an audio signal is output, and an optical output unit from which an audio signal and an image signal are output.

The front cover and the back cover may be connected in a snap-fit manner.

Embodiments of the present general inventive concept also provides a display device which includes a display module including a display panel and a back light unit, a front cover provided in front of the display module to receive the display module, a main board electrically connected with the display module to control the display module, and including a power input unit and at least one image signal input unit, an inverter board electrically connected directly with the main board to supply power to the back light unit, a bracket provided on the rear surface of the display module to support the main board and the inverter board, and a back cover forming the rear surface of the display device and connected with the front cover, wherein the bracket is fixed by connecting the front cover and the back cover.

The main board may further include an inverter board connection terminal to achieve connection with the inverter board, the inverter board may include a main board connection terminal provided to be fitted to the inverter board connection terminal, and the main board and the inverter board may be connected by fitting the inverter board connection terminal and the main board connection terminal to each other.

The display module may further include a bottom chassis provided to receive the display panel and the back light unit, and the bottom chassis may include a cable receipt groove provided to receive a cable connecting the back light unit and the inverter board.

The bracket may include a shielding part provided to block electromagnetic waves generated from the main board.

The bracket may include an inverter board holding part provided to allow the inverter board to be inserted thereinto, and the inverter board holding part may include side guides to guide the side surface of the inverter board, upper guides to guide the upper portion of the inverter board, and lower guides to guide the lower portion of the inverter board.

The bracket may include electromagnetic wave blocking gaskets provided between the bracket and the display module to block electromagnetic waves.

In another feature, a control panel included with a display device may comprises a cable recipient groove formed on a first surface of the control panel and including a groove discharge hole to receive an electrical cable, and first and second cable parts extending from the cable recipient groove and electrically connected to the electrical cable to conduct electricity.

Embodiments of the present general inventive concept also provide a display device including a display panel to display an image, comprises a first control panel including a cable recipient groove formed on a first surface of the control panel and including a groove discharge hole to receive an electrical cable and including first and second cable parts extending from the cable recipient groove and electrically connected to the electrical cable to conduct electricity, and a second control panel including first and second contact portions and being disposed against the first control panel such that the first contact portion contacts the first terminal and the second contact contacts the second terminal.

BRIEF DESCRIPTION OF THE DRAWINGS

The above and/or other features of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
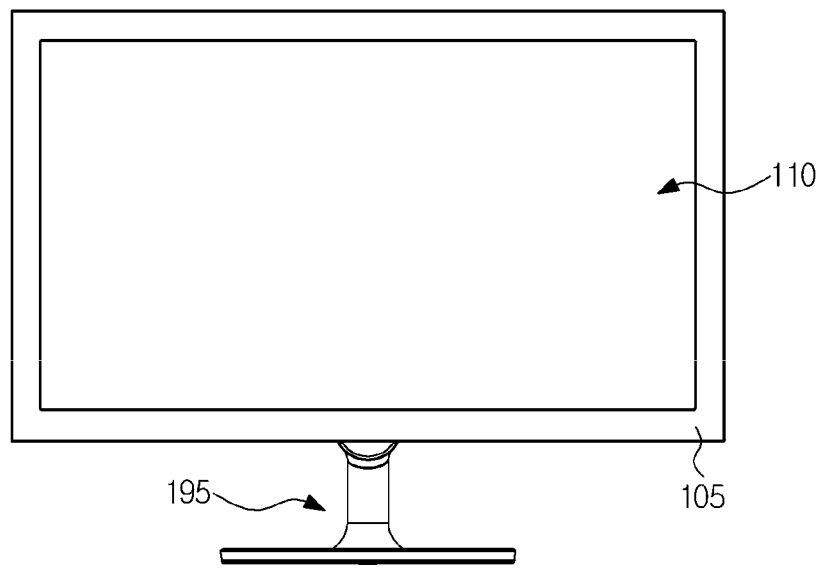
FIG. 1 is a front view of a display device in accordance with an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
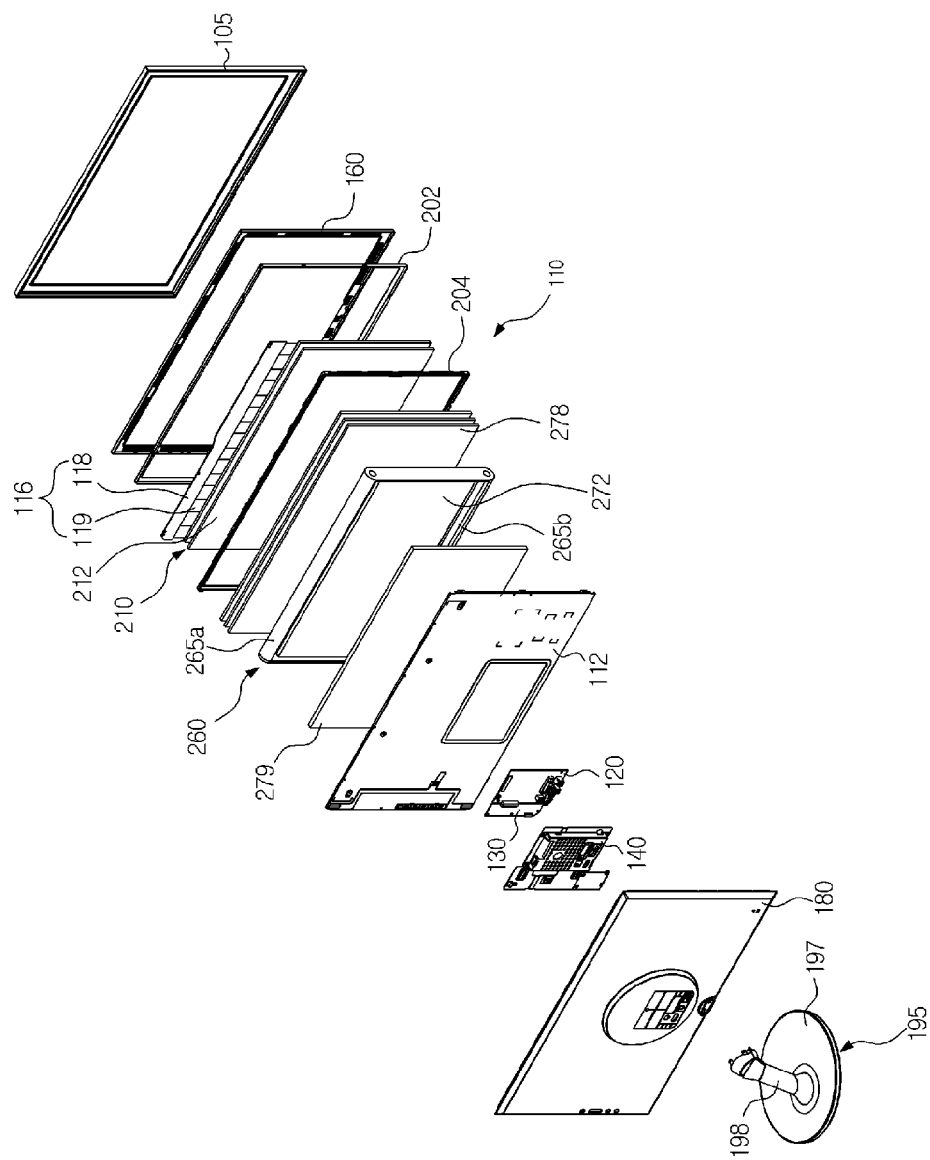
FIG. 2 is an exploded perspective view of the display device of FIG. 1.
Figure 3:
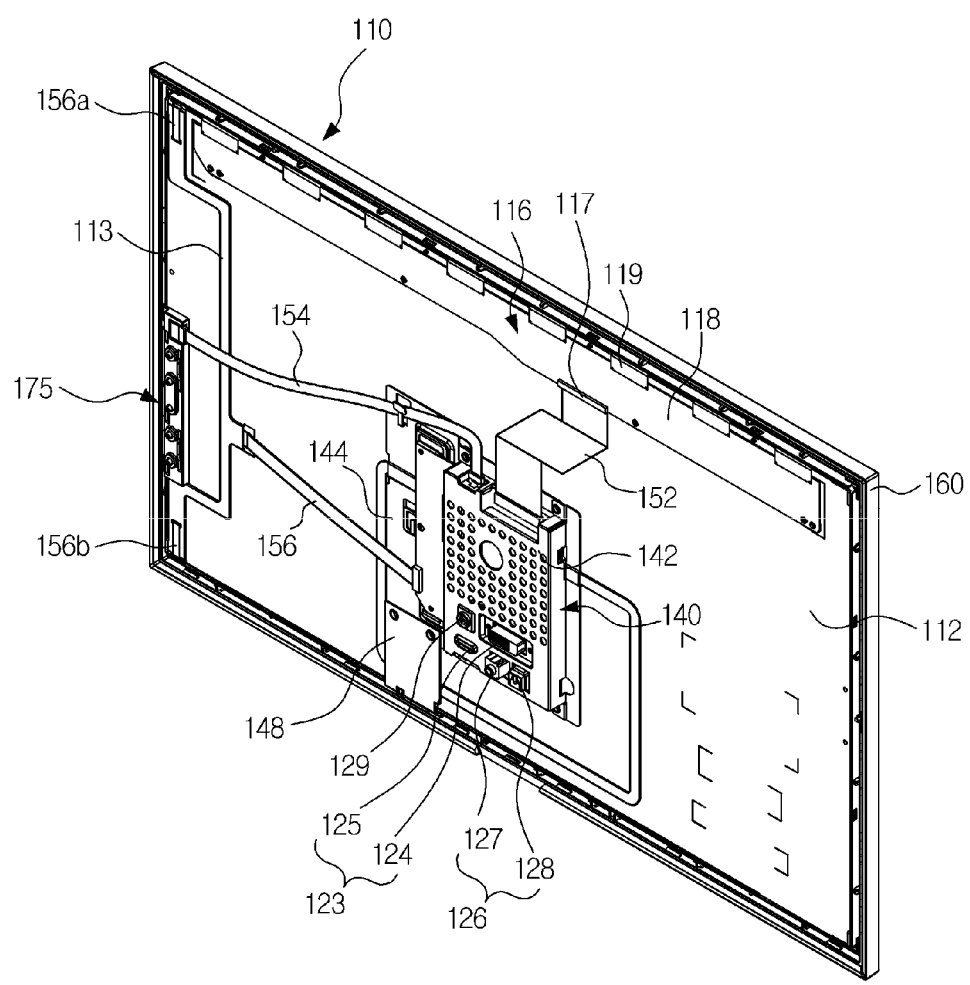
FIG. 3 is a perspective view illustrating an assembled state of a display module, a front cover, a main board, an inverter board, and a bracket.
Figure 4:
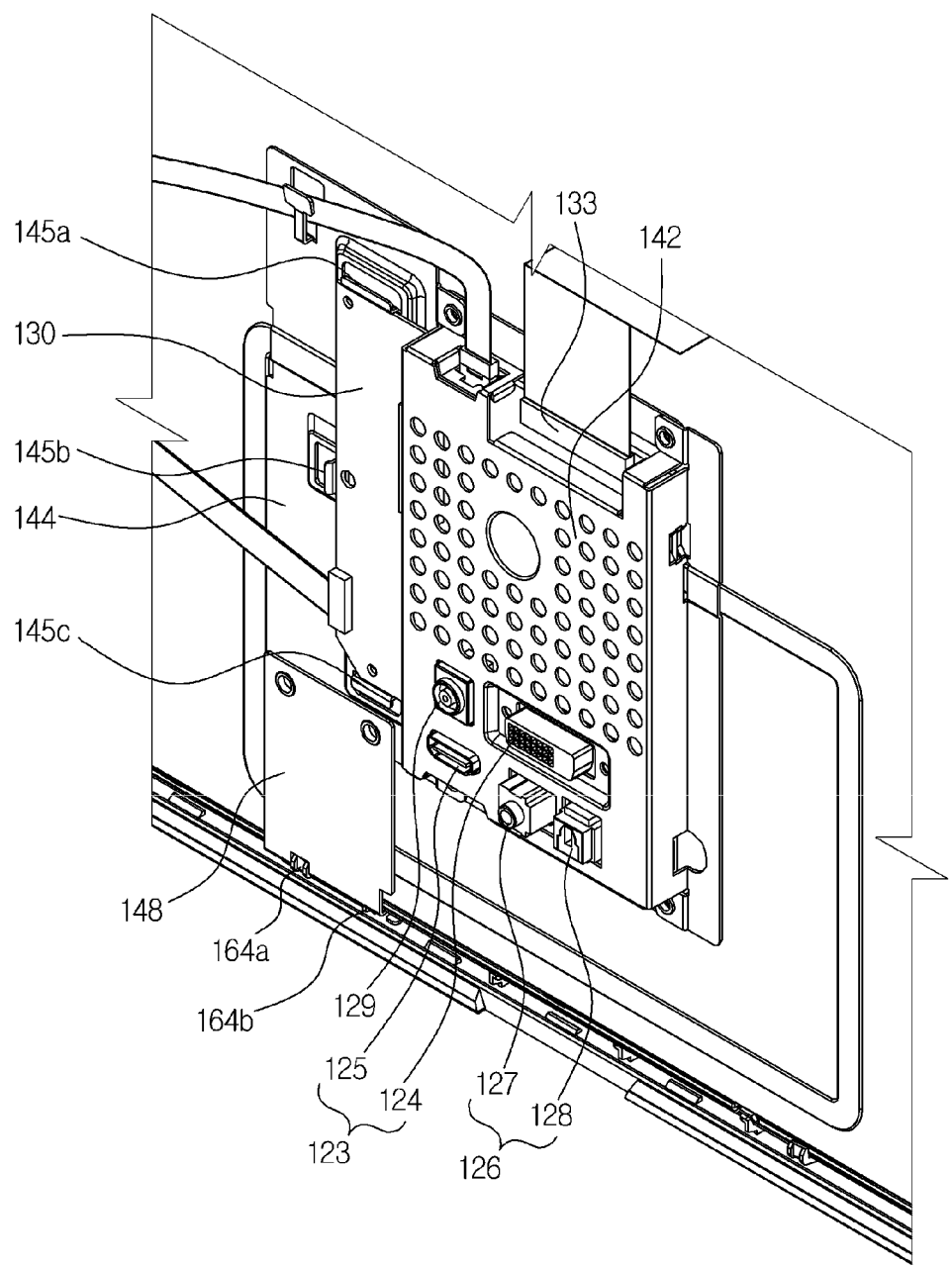
FIG. 4 is an enlarged perspective view of bracket surroundings.
Figure 5:
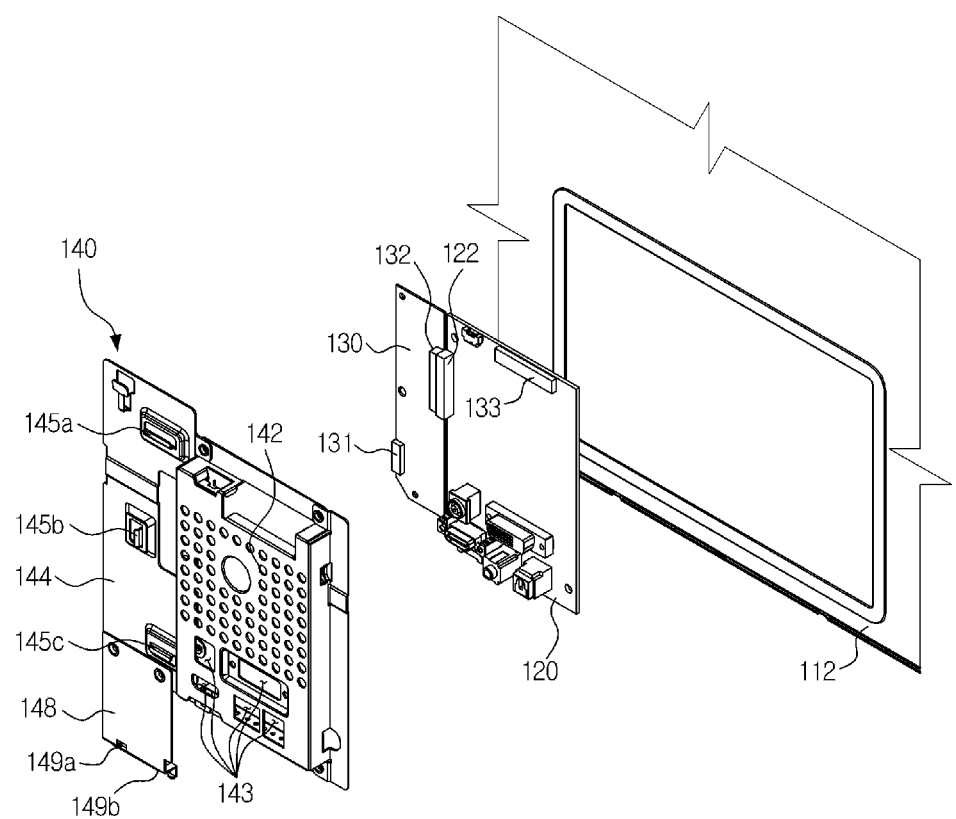
FIG. 5 is an exploded perspective view of FIG. 4.

Referring to FIGS. 1 to 3, a display device 1 in accordance with exemplary embodiments of the general inventive concept includes a display module 110 to display an image, a front cover 160 provided in front of the display module 110 to receive the display module 110, a main board 120 electrically connected with the display module 110, an inverter board 130 disposed adjacent to the main board 120 and electrically connected with the main board 120, a bracket 140 disposed on the rear surface of the display module 110 to support the main board 120 and the inverter board 130, and a back cover 180 forming the rear surface of the display device 1.

A decorative cover 105 to decorate the external appearance of the front portion of the display device 1 is connected to the front portion of the front cover 160. A stand 195 includes a stand neck 198 having one end that is connected to the lower portion of the display device 1, and an opposite end that is connected to a base 197 to support the display device 1 on a surface. The base 195 may be formed in a flat shape to support the display device 1 on the surface.

The display module 110 includes a display panel 210 on which an image may be displayed.

The display panel 210 may include a liquid crystal display (LCD) panel 212 on which the image is displayed, and a panel actuating part 116 to actuate the liquid crystal display panel 212. Although at least one exemplary embodiment describes an LCD panel 212 to display images, it can be appreciated that other display panels may be used, such as an organic light emitting diode (OLED) panel, etc. The liquid crystal display panel 212 includes a thin film transistor substrate (not shown), a color filter substrate (not shown), and liquid crystals (not shown). An alignment angle of the liquid crystals injected into a gap between the thin film transistor substrate and the color filter substrate is changed and optical transmittance is changed according to the change of the alignment angle of the liquid crystals, thereby producing desired pixels. The liquid crystal display panel 212 includes a thin film transistor substrate (not shown), a color filter substrate (not shown), and liquid crystals (not shown). An alignment angle of the liquid crystals injected into a gap between the thin film transistor substrate and the color filter substrate is changed and optical transmittance is changed according to the change of the alignment angle of the liquid crystals, thereby producing desired pixels.

The panel actuating part 116 includes an actuating terminal 117 mounted on a printed circuit board (PCB) 118 to actuate the liquid crystal display panel 212, and a Tape Carrier Package (TCP) 119. The printed circuit board 118 includes, but is not limited to, a flexible PCB 118 that may be manipulated, for example, flexed, folded, bent, etc., into various positions to provide easier access to components disposed on the PCB 118. The PCB 118 may further include an actuating circuit connected to the TCP 119 to apply an actuating signal of the liquid crystal display panel 212, and a timing controller to apply a timing signal. The TCP 19 includes a wiring pattern to provide actuating signals to the liquid crystal display panel 212, and a connector to achieve electrical connection with the printed circuit board 118.

The display panel 210 may further include a back light unit 260 to provide uniform light to the liquid crystal panel 212. The back light unit 260 includes lamp units 265a and 265b to generate light, a light guide plate 272 to guide light generated from the lamp units 265a and 265b toward the liquid crystal display panel 212, a plurality of optical sheets 278 disposed on the front surface of the light guide plate 272 to uniformly maintain brightness of the light guided to the liquid crystal display panel 212, and a reflection plate 279 disposed on the rear surface of the light guide plate 272 to reflect leaked light to the light guide plate 272 so as to raise brightness efficiency of the light.

The display module 110 further includes a mold frame 204, a top chassis 202, and a bottom chassis 112. A receipt space is formed between the top chassis 202 and mold frame 204 and the bottom chassis 112 to receive the display panel 210 and back light unit 260. By coupling together the top chassis 202, the mold frame 204 and the bottom chassis 112, the display panel 210 and back light unit 260 are fixed in place.

Referring now to FIGS. 3 to 7, operation of the display module 110 is controlled by the main board 120 and the inverter board 130. The main board 120 is electrically connected with the display panel 210 of the display module 110, and the inverter board 130 is electrically connected with both of the back light unit 260 as well as the main board 120. The connections of the main board 120 and the inverter board 130 are discussed in greater detail below.

The main board 120 controls the overall operation of the display module 110, as described in greater detail below. The main board 120 is connected with the panel actuating part 116 of the display panel 210 via a first cable 152. More specifically, a rear surface of the flexible PCB 118 is folded over a top portion of the bottom chassis such that the rear surface of the flex PCB is disposed flush against the rear surface of the bottom chassis 112. One end of the first cable 152 is connected to a first cable terminal 133 of the main board 120 while the other end of the main cable 152 is connected to the actuator terminal 117 such that main board 120 is connected to the panel actuating part 116. Additionally, the main board 120 is connected with a menu button part 175 provided at one side of the display module 110 via a second cable 154.

The inverter board 130 is directly connected to the left side of the main board 120 to provide an electrical communication interface therebetween. More specifically, a connection of the inverter board 130 to the left side of the main board 120 is achieved by fitting a main board connection terminal 132 provided at the right side of the inverter board 130 and an inverter board connection terminal 122 provided at the left side of the main board 120 to each other.

The main board 120 includes an input unit 123 to which an external signal is input, an output unit 126 from which a signal is output, and a power input unit 129 to which power is input.

The input unit 123 include a Digital Visual Interface (DVI) input unit 124 to which an image signal is input. The input unit 123 also includes a High Definition Multimedia Interface (HDMI) input unit 125 that provides an alternative input interface to which an image signal and an audio signal are input. The DVI input unit 124 and the HDMI input unit 125 are provided in a terminal type, respectively. External equipment, such as a computer or a DVD player, is connected to each of the DVI input unit 124 and the HDMI input unit 125 so that an external signal is input to each of the DVI input unit 124 and the HDMI input unit 125.

The output unit 126 includes a speaker output unit 127 from which an audio signal is output, and an optical output unit 128 from which an audio signal and an image signal are output. The speaker output unit 127 and the optical output unit 128 are provided in a terminal type, respectively. External speakers or headphones may be connected to each of the speaker output unit 127 and the optical output unit 128.

The inverter board 130 is electrically connected to the main board 120 via the main board terminal 130 and board connection terminal 132, as mentioned above. Accordingly, the main board 120 may control the inverter board 130 to supply power to the back light unit 260. The inverter board 130 is connected to the back light unit 260 by a third cable 156, as discussed further below.

The bracket 140 is provided to support and fix the main board 120 and the inverter board 130 to the bottom chassis 112. Additionally, the bracket may block electromagnetic waves that could interfere with electrical operations of the main board 120 and the inverter board 130. More specifically, the bracket 140 includes a shielding part 142 provided at one side that may inhibit electromagnetic waves from traveling therethrough. The shielding part further includes an inverter board holding part 144 and a supporting and fixing part 148. The inverter board holding part 144 is provided at the opposite side of the shielding part 142 to allow the inverter board 130 to be inserted therein. The support and fixing part 148 is provided under the inverter board holding part 144 to support the bracket 140 and to fix the bracket 140 to the inside of the display device 1.

The main board 120 may be fixed to the inside of the shielding part 142 using, for example, bolts (not shown), and a plurality of through holes 143 to expose the input unit 123, the output unit 126, and the power input unit 129 to the outside are formed through the lower portion of the shielding part 142. The shielding part 142 serves to receive and surround the main board 120, while simultaneously inhibiting the reception of electromagnetic waves. The shielding part 142 may be made of material, including, but not limited to, metal, foam, and plasma, and ionized gas. In this case, the shielding part 142 may also surround the inverter board 130 as well as the main board 120 so as to inhibit electromagnetic waves received by the inverter board 130. However, although the shielding part 142 may shield only the main board 120, as in at least one exemplary embodiment of the present general inventive concept, a sufficient electromagnetic wave blocking effect may be achieved. Further, in order to minimize a protruded portion of the back cover 180, which will be described later, and to obtain a compact structure of the display device 1, at least one exemplary embodiment provides the shielding part 142 to surround only the main board 120.

Figure 6:
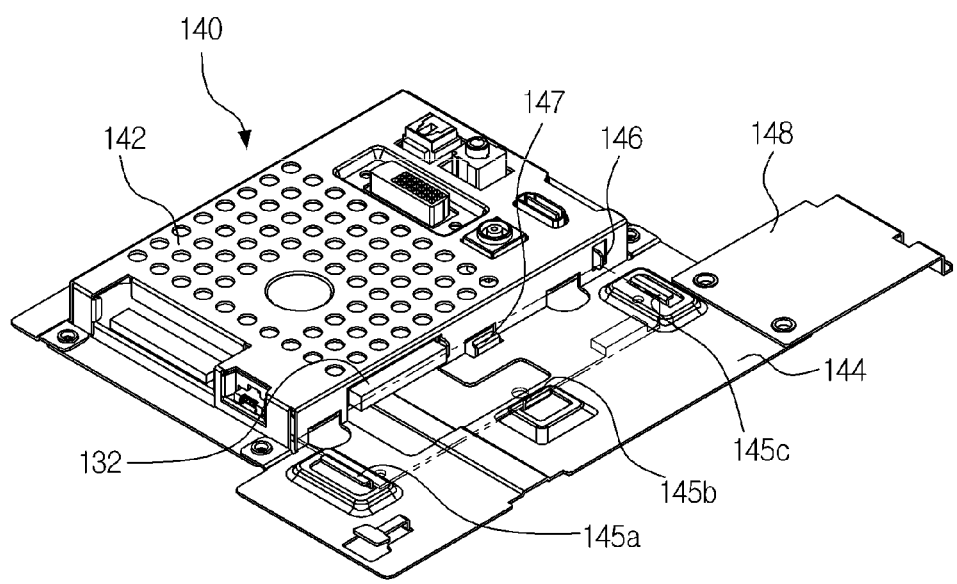
FIG. 6 is a perspective view illustrating a seated state of the inverter board.

The inverter board 130 is seated on the inverter board holding part 144 when the inverter board 130 is fitted to the main board 120 connected to the inside of the shielding part 142. That is, when the main board 120 is connected to the inside of the shielding part 142, the inverter board 130 approaches the left side of the main board 120, and is connected with the main board 120 by fitting the main board connection terminal 132 and the inverter board connection terminal 122 to each other. Here, the inverter board 130 may be guided into position via side guides 145a, 145b, and 145c that guide a side surface of the inverter board 130, an upper guide 146 guiding the upper surface of the inverter board 130, and a lower guide 147 guiding the lower surface of the inverter board 130, thus being easily seated on the inverter board holding part 144, as illustrated in FIG. 6.

The support and fixing part 148 is extended from the lower portion of the inverter board holding part 144 and reaches the lower edge of the front cover 160. Fixing protrusions 164a and 164b protruded from the lower edge of the front cover 160 are inserted into fixing holes 149a and 149b formed on the lower portion of the support and fixing part 148. When the fixing protrusions 164a and 164b are inserted into the fixing holes 149a and 149b, the bracket 140 is temporarily fixed to the rear surface of the display module 110. Thus, when the back cover 160 is connected to the display module 110, the bracket 140 is completely fixed to the rear surface of the display module 110. That is, the position of the support and fixing part 148 is guided by inserting the fixing protrusions 164a and 164b into the fixing holes 149a and 149b.

Figure 7:
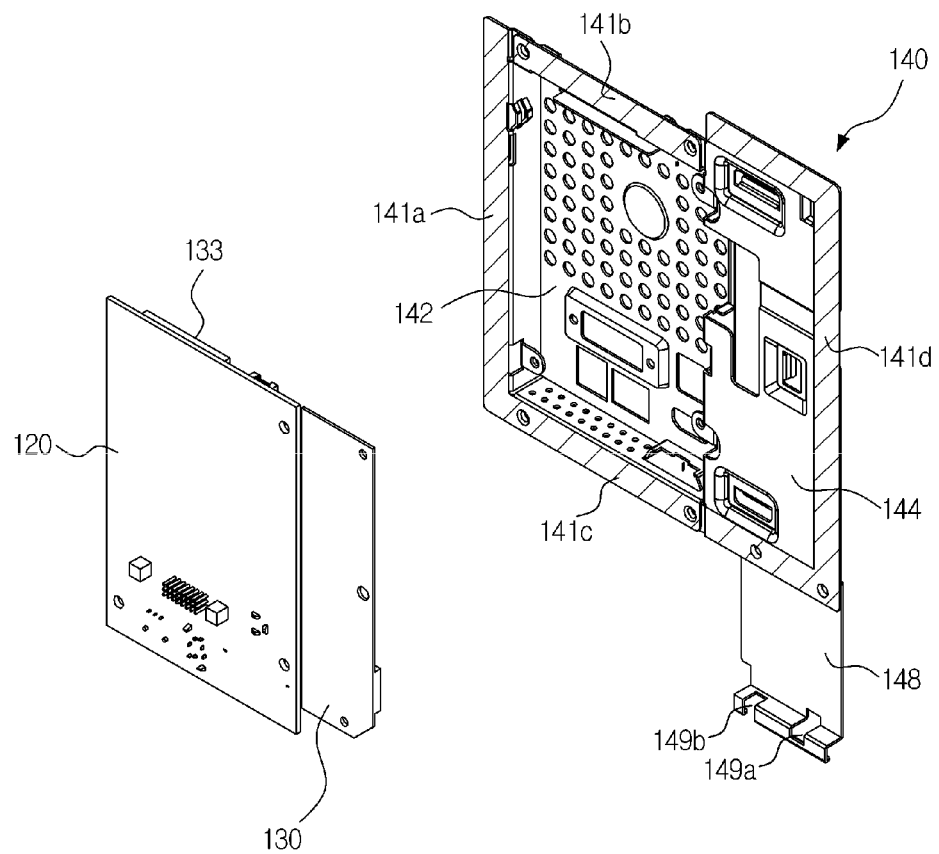
FIG. 7 is a perspective view illustrating the inside of the bracket.

The bracket 140, as shown in FIG. 7, includes electromagnetic wave blocking gaskets 141a, 141b, 141c, and 141d provided between the bracket 140 and the display module 110 to inhibit electromagnetic waves from passing therethrough. Accordingly, an electromagnetic wave blocking effect of the bracket 140 may be enhanced by the electromagnetic wave blocking gaskets 141a, 141b, 141c, and 141d.

As described above, by directly connecting the main board 120 and the inverter board 130 such that the bracket 140 including the shielding part 142 and the inverter board holding part 144, and the support and fixing part 148 supports the connected main board 120 and inverter board 130, the internal structure of the display device 1 is simplified and compact. Accordingly, a slimmer display device 1 may be achieved.

Figure 8A:
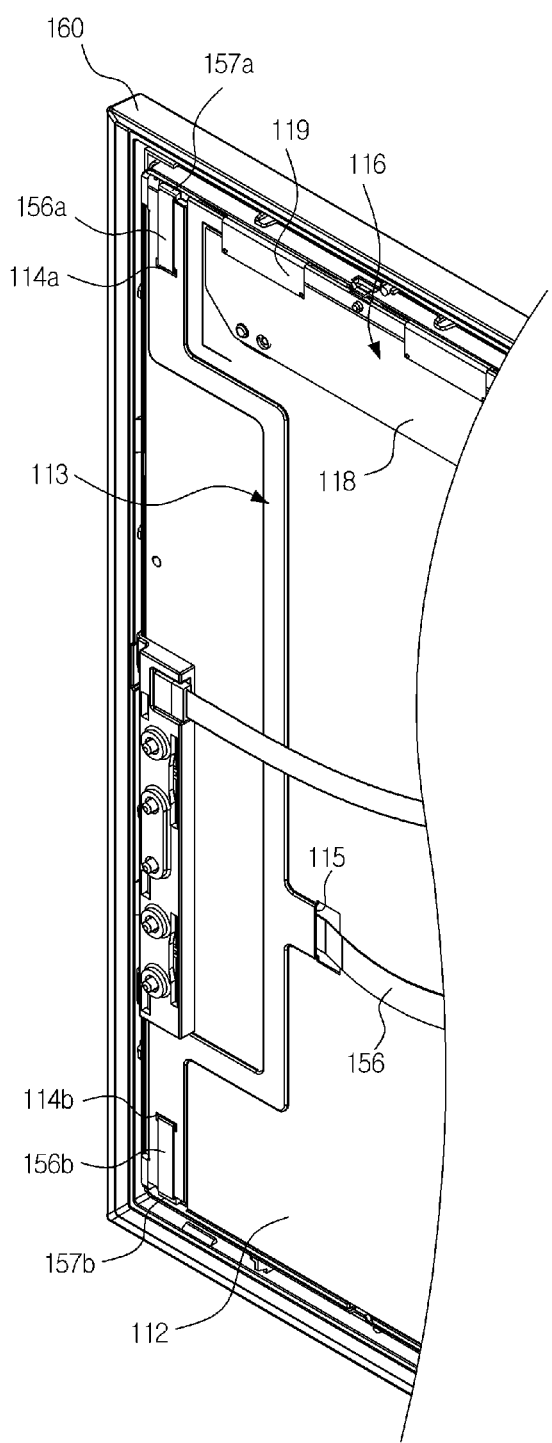
FIG. 8A is a view illustrating a disposed state of a third cable.
Figure 8B:
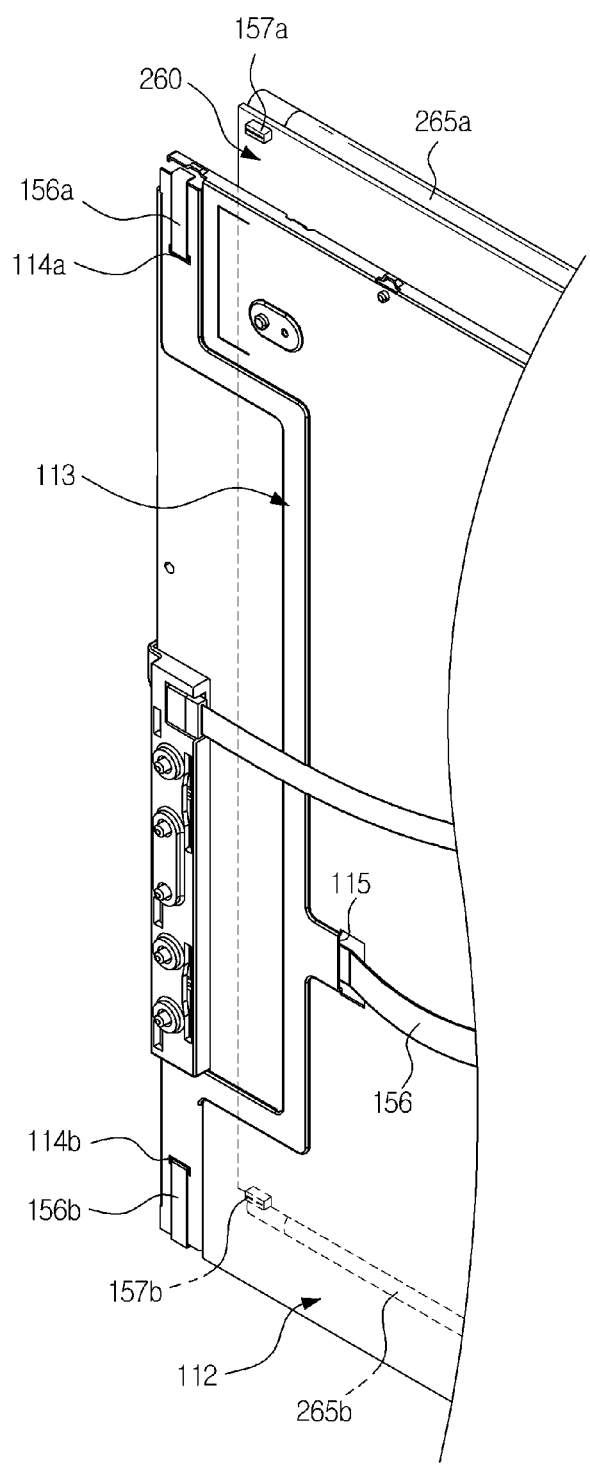
FIG. 8B is an exploded perspective view of a bottom chassis and a back light unit.

FIG. 8A is a view illustrating a disposed state of the third cable, while FIG. 8B is an exploded perspective view of a bottom chassis and a back light unit prior to being connected to one another.

As shown in FIGS. 8A-8B, the bottom chassis 112 includes a cable receipt groove 113 to receive the third cable 156 that connects the inverter board 130 to the back light unit 260. The bottom chassis 112 further includes a plurality of third cable parts 156a, 156b to access a portion of the third cable 156.

The cable receipt groove 113 may be formed by binding one of the third cable parts 156a disposed on the upper portion of the display module 110 and connected with the lamp unit 265a, and the other third cable part 156b disposed on the lower portion of the display module 110 and connected with the lamp unit 265b. More specifically, each of the lamp units 265a, 265b may include contact portions 157a, 157b disposed on upper and lower portions of the back light unit 260 to contact a respective third cable part 156a, 156b, such that back light unit 260 may be electrically connected to the third cable 156, as shown in FIG. 8B. Accordingly, the third cable parts 156a and 156b may be connected to the inverter board 130 via the third cable 156 such that the inverter board 130 may control operation of the lamp units 165a, 165b of the back light unit 260.

Cable receipt groove entrance holes 114a and 114b, through which the third cable parts 156a and 156b enter the cable receipt groove 113, may be formed on the upper and lower portions of the bottom chassis 112, and a cable receipt groove discharge hole 115, through which the third cable 156 having passed through the cable receipt groove 113 is discharged, may be formed at the center of the bottom chassis 112. Accordingly, the receipt groove 113 allows internal wiring of the display device 1 to be simple and compact.

Figure 9:
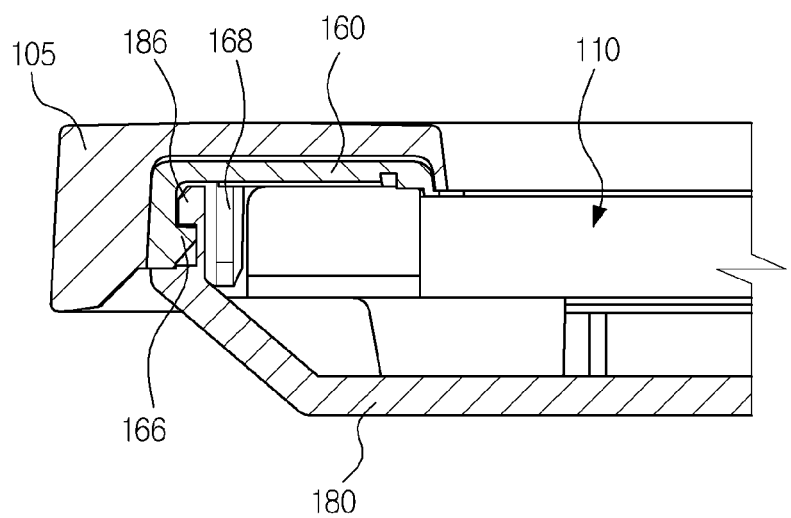
FIG. 9 is a view illustrating an internal connection structure of the display device.

FIG. 9 is a view illustrating an internal connection structure of the display device 1.

As shown in FIG. 9, the front cover 160 and the back cover 180 may be coupled together, for example, in a snap-fit manner. That is, in at least one exemplary embodiment illustrated in FIG. 9, the front cover 160 and the back cover 180 are connected in a snap-fit manner such that the display module 110 is disposed between the front cover 160 and the back cover 180, thereby allowing the display device 1 to be conveniently assembled.

In the exemplary embodiment illustrated in FIG. 9, a plurality of first hooks 166 and a plurality of corresponding second hooks 186 are provided to achieve the connection in the snap-fit manner. More specifically, a plurality of first hooks 166 may be formed at the edge of the front cover 160, and a plurality of second hooks 186 may be formed at the edge of the back cover 180. The first hooks 166 and the second hooks 186 may interconnect each other, thereby coupling the front cover 160 and the back cover 180. Further, in order to facilitate the connection of the first hooks 166 and the second hooks 186, a plurality of insertion guides 168 separated from the first hooks 166 may be provided on the front cover 160

Due to the above simple connecting process of the front cover 160 and the back cover 180, an assembly process of the display device 1 is simplified and assembly efficiency of the display device 1 is enhanced.

Figure 10:
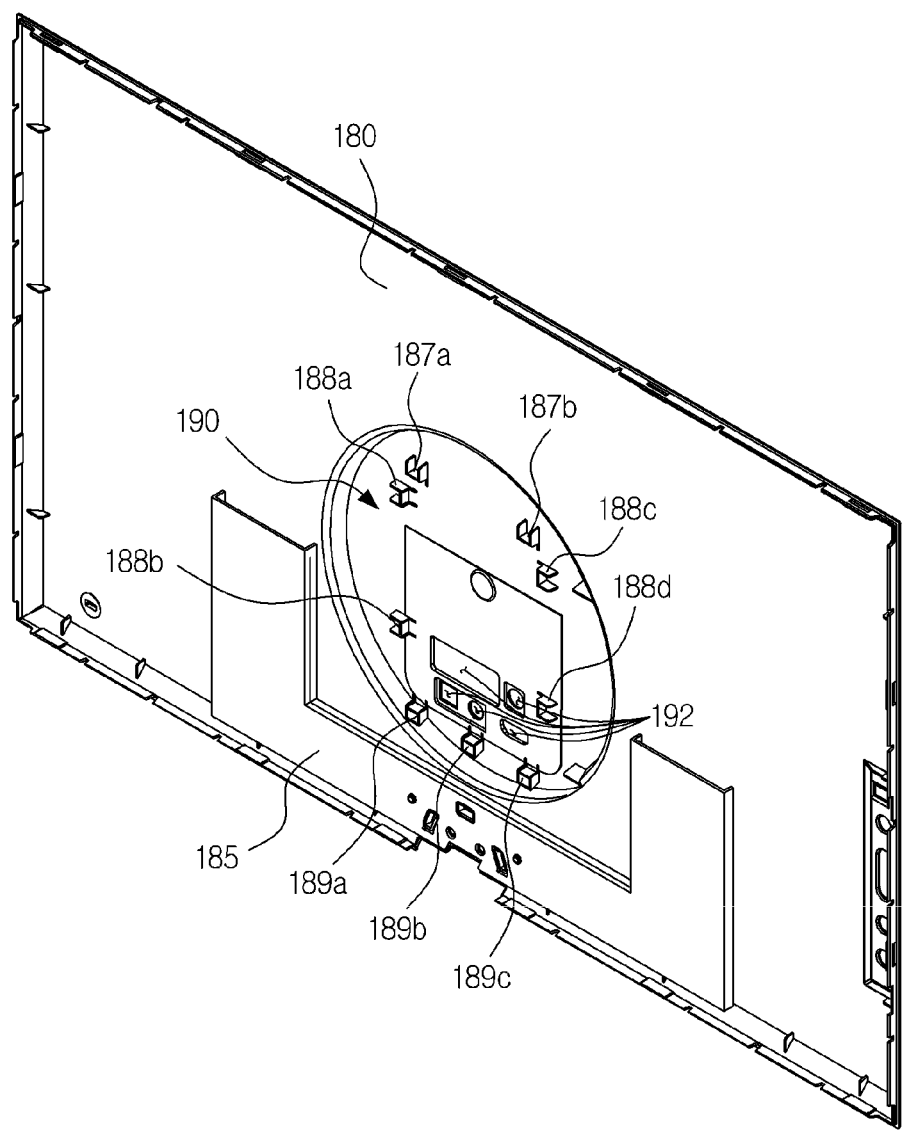
FIG. 10 is a perspective view illustrating the inner surface of a back cover.

FIG. 10 is a perspective view illustrating the inner surface of the back cover.

As shown in an exemplary embodiment of FIG. 10, the back cover 180 includes a reinforcing bracket 185 formed on the inner surface thereof to reinforce the strength of the back cover 180. The reinforcing bracket 185 is provided around the lower end of the central portion of the inner surface of the back cover 180 may be directly connected with the stand 195 to reinforce the strength of the back cover 180.

Further, a circular bracket receipt part 190 is provided at the center of the inner surface of the back cover 180. The bracket receipt part 190 includes upper guides 187a and 187b, side guides 188a, 188b, 188c, and 188d, and lower guides 189a, 189b, and 189c to guide the position of the shielding part 142. The bracket receipt part 1990 further includes a plurality of back cover through holes 192 respectively provided in shapes corresponding to those of the input unit 123, the output unit 126, and the power input unit 129 of the main board 120 so as to expose the input unit 123, the output unit 126, and the power input unit 129 to the outside of the back cover 180.

Figure 11:
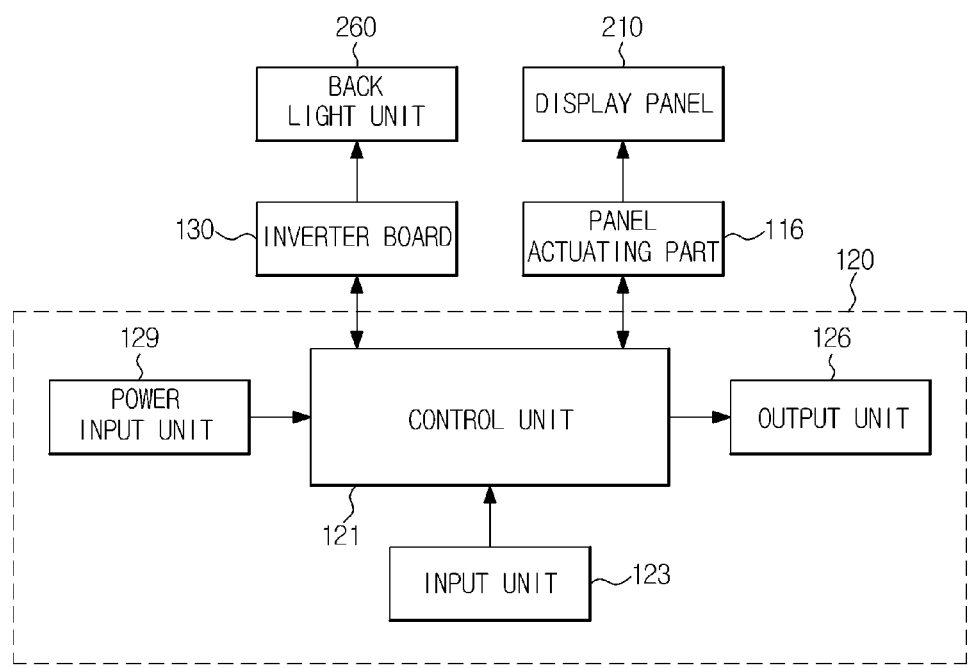
FIG. 11 is a block diagram illustrating operating relations of a display device in accordance with one embodiment of the present general inventive concept.

FIG. 11 is a block diagram illustrating operating relations of a display device 1 in accordance with an exemplary embodiment of the present general inventive concept.

As shown in at least one exemplary embodiment of FIG. 11, control of the display device 1 may be achieved by a control unit 121 of the main board 120. Power to actuate the overall display device 1 is supplied to the control unit 121 through the power input unit 129 and is then transmitted to the inverter board 130 and the panel actuating part 116. An image signal and an audio signal from external equipment, such as a computer or a DVD player, are input to the control unit 121 through the input unit 123. If the display device 1 transmits a signal from the inside to the outside of the display device 1, the signal is transmitted to the outside of the display device 1 through the output unit 126.

The control unit 121 may control power supply to the back light unit 260 while transmitting a signal to, and receiving a signal from, the inverter board 130. Further, the control unit 121 may control operation of the display panel 210 and may supply power to the display panel 210 while transmitting a signal to, and receiving a signal from, the panel actuating part 116. As described above, the display device 1 may be operated via the main board 120.

As is apparent from the above description, a display device in accordance with at least one exemplary embodiment of the present general inventive concept improves an installation structure of a circuit board, while providing a compact structure.

Further, a slimmer display device may be achieved.

Although a few exemplary embodiments of the present general inventive concept have been shown and described, it would be appreciated by those skilled in the art that changes may be made in these exemplary embodiments without departing from the principles and spirit of the general inventive concept, the scope of which is defined in the claims and their equivalents.

What is claimed is:

1. A display device comprising:
    a display module including a display panel facing a first direction;
    a panel actuating part including a printed circuit board and a tape carrier package (TCP), and the printed circuit board includes an actuating circuit to apply an actuating signal of the display panel and a timing controller to apply a timing signal;
    a plurality of boards disposed at a rear side of the display module and configured to supply a image signal and a power to the display module;
    a button part having a plurality of buttons facing a second direction substantially opposite to the first direction, and disposed at the rear side of the display module; and
    a cover disposed at the rear side of the display module, and the cover having at least one hole to expose a portion of the button part.

2. The display device according to claim 1, wherein the plurality of boards comprise:
    a first board disposed at the rear side of the display module and having a plurality of external signal input terminals; and
    a second board configured to supply the power to the display module and disposed at the rear side of the display module with the first board.

3. The display apparatus according to claim 1, wherein the cover has the at least one hole formed in a plane of the cover substantially parallel with the display panel to expose the portion of the button part.

4. The display apparatus according to claim 1, wherein the portion of the button part exposed by the hole includes at least one button.

5. A display apparatus comprising:
    a display module including a display panel;
    an input unit configured to receive external signals;
    a control unit configured to control the display panel to display images based on the received external signals;
    a plurality of buttons are externally all exposed are located at a rear side of the display module; and
    a cover coupled to the display module.

6. The display apparatus according to claim 5, further comprising:
    a bracket disposed between the display module and the cover, and
    a stand connectable to the bracket to support the display apparatus.

7. The display apparatus according to claim 5, further comprises a first board configured to supply signals to the display module,
    wherein the input unit and the control unit are disposed on the first board.

8. The display apparatus according to claim 7, further comprises a second board configured to supply power to the display module,
    wherein the first board and the second board are disposed at a rear side of the display module.

9. The display apparatus according to claim 7, wherein the buttons are connected to the control unit thorough the first board.

10. A display apparatus comprising:
    a display module including a display panel;
    an input unit configured to receive external signals;
    a control unit configured to control the display panel to display images based on the received external signals;
    a button part having a plurality of buttons; and
    a cover disposed at the rear side of the display module and having a plurality of holes,
    wherein the input unit and the button part are located at one side opposite a surface of the display panel,
    a portion of the input unit is exposed by at least one hole of the plurality of holes, and
    a portion of the button part is exposed by at least one other hole of the plurality of holes.

11. The display apparatus according to claim 10, further comprising a first board,
    wherein the input unit includes an input terminal located at the first board.

12. The display apparatus according to claim 11, further comprising a second board configured to supply power to the display module,
    wherein the first board and the second board are disposed at a rear side of the display module.

13. The display apparatus according to claim 10, wherein the plurality of buttons are arranged in a line.

14. The display apparatus according to claim 10, further comprising a bracket disposed between the display module and the cover.

15. The display apparatus according to claim 14, further comprising a stand connectable to the bracket to support the display apparatus.

16. The display apparatus according to claim 10, wherein the portion of the button part exposed by the hole includes at least one button.

* * * * *

UNITED STATES PATENT AND TRADEMARK OFFICE
CERTIFICATE OF CORRECTION

PATENT NO.        : 9,844,153 B2                                      Page 1 of 1
APPLICATION NO.   : 15/175683
DATED             : December 12, 2017
INVENTOR(S)       : Kwang Sung Hwang et al.

It is certified that error appears in the above-identified patent and that said Letters Patent is hereby corrected as shown below:

In the Claims

Column 9, Line 48:
In Claim 3, delete "apparatus" and insert -- device --, therefore.

Column 9, Line 52:
In Claim 4, delete "apparatus" and insert -- device --, therefore.

Signed and Sealed this
Sixth Day of February, 2018

Joseph Matal
*Performing the Functions and Duties of the*
*Under Secretary of Commerce for Intellectual Property and*
*Director of the United States Patent and Trademark Office*